United States Patent
Ruppert

(10) Patent No.: US 11,791,727 B2
(45) Date of Patent: Oct. 17, 2023

(54) HALF-BRIDGE MODULE WITH PRECISE TEMPERATURE DETECTION

(71) Applicant: AUDI AG, Ingolstadt (DE)

(72) Inventor: Daniel Ruppert, Lenting (DE)

(73) Assignee: AUDI AG, Ingolstadt (DE)

( * ) Notice: Subject to any disclaimer, the term of this patent is extended or adjusted under 35 U.S.C. 154(b) by 147 days.

(21) Appl. No.: 17/502,430

(22) Filed: Oct. 15, 2021

(65) Prior Publication Data

US 2022/0166317 A1 May 26, 2022

(30) Foreign Application Priority Data

Nov. 24, 2020 (DE) ..................... 10 2020 130 991.0

(51) Int. Cl.
| | | |
|---|---|---|
| *H02M 3/158* | (2006.01) | |
| *G01K 7/16* | (2006.01) | |
| *H02M 1/32* | (2007.01) | |

(52) U.S. Cl.
CPC .............. *H02M 3/158* (2013.01); *G01K 7/16* (2013.01); *H02M 1/327* (2021.05)

(58) Field of Classification Search
CPC .......... H02M 1/32; H02M 3/335; H02M 1/36; H02M 1/007
See application file for complete search history.

(56) References Cited

U.S. PATENT DOCUMENTS

| | | | |
|---|---|---|---|
| 10,469,020 B2 | 11/2019 | Sano et al. | |
| 2011/0075451 A1* | 3/2011 | Bayerer | ................... H01L 24/85 |
| | | | 257/692 |
| 2015/0364524 A1* | 12/2015 | Kadow | ..................... G01K 7/01 |
| | | | 327/512 |
| 2016/0099560 A1 | 4/2016 | Yamada et al. | |
| 2019/0140536 A1* | 5/2019 | Ikeda | ....................... H02M 1/32 |

FOREIGN PATENT DOCUMENTS

| | | |
|---|---|---|
| CN | 210775735 U | 6/2020 |
| DE | 10 2009 012 500 A1 | 9/2010 |
| DE | 10 2009 045 181 A1 | 4/2011 |
| DE | 10 2014 217 299 A1 | 3/2016 |

OTHER PUBLICATIONS

Examination Report dated Jul. 7, 2021 in corresponding German application No. 10 2020 130 991.0; 10 pages Including Machine-generated English-language translation.

* cited by examiner

*Primary Examiner* — Adolf D Berhane
*Assistant Examiner* — Afework S Demisse
(74) *Attorney, Agent, or Firm* — Maier & Maier, PLLC

(57) ABSTRACT

A half-bridge module having two switching units, each of which includes multiple transistors connected in parallel and/or in series, in particular IGBTs or MOSFETs. The transistors are arranged on a first substrate. The half-bridge module has a temperature sensor matrix having a plurality of temperature sensors, and the temperature sensors are thermally connected to the transistors at least in some regions. A temperature sensor matrix is also provided.

10 Claims, 2 Drawing Sheets

HALF-BRIDGE MODULE WITH PRECISE TEMPERATURE DETECTION

FIELD

The invention relates to a half-bridge module having two switching units, each of which consists of multiple transistors connected in parallel and/or in series, in particular IGBTs or MOSFETs, and a temperature sensor matrix.

BACKGROUND

Electric vehicles currently produced have a drive converter or inverter to drive the electric machine, which converts the direct current of the traction battery into an alternating current or three-phase current suitable for the electric machine. Such a drive converter essentially consists of an intermediate circuit capacitor, a power semiconductor, a driver board, and a controller board. Preferably, drive converters for electric vehicles are designed to be three-phase.

The power semiconductor is often designed as a bridge rectifier, for example as a so-called B6 bridge rectifier, and has a large number of transistors. Due to the low yield or the high level of rejects in production, silicon carbide MOSFET power modules in particular are manufactured in half-bridge configuration or as half-bridge modules. This can reduce the level of rejects in production. A power semiconductor can thus be constructed from three half-bridge modules.

To ensure safe operation of the power semiconductor, a temperature sensor is used to monitor the temperature of the transistors. In the case of a transistor designed as an IGBT, the maximum permissible junction temperature is 165° C. To increase the efficiency of the drive converter in the future, silicon carbide MOSFETs will be used as transistors. Due to lower switching losses and the low channel resistance, these achieve efficiency advantages in the partial load range. In addition, such transistors can be operated with a maximum junction temperature of 200° C.

Operating the transistors of the power semiconductor in the range of the limit temperature, however, requires precise temperature measurement of the respective transistors. Usually one temperature sensor is used per half-bridge module. Because the temperature measurement takes place only at one point within the half-bridge module, the actual chip temperature of the respective transistors can be modeled or estimated based on a point measurement. Such a modeling of the temperature distribution is usually subject to tolerances and errors.

In order to nevertheless ensure safe operation of the transistors in the power semiconductor, sufficient safeguards are maintained with regard to the operating temperature, so that cost-intensive oversizing of the power semiconductor and the entire drive converter results.

SUMMARY

The object of the present invention is to provide a half-bridge module with precise temperature measurement and a temperature sensor matrix for a half-bridge module which can detect a temperature distribution within the half-bridge module.

According to the invention, this object is achieved by a half-bridge module and by a temperature sensor matrix.

The half-bridge module according to the invention has two switching units, each of which consists of multiple transistors connected in parallel and/or in series, in particular IGBTs or MOSFETs. The transistors are arranged on a first substrate. According to the invention, the half-bridge module has a temperature sensor matrix having a plurality of temperature sensors, wherein the temperature sensors are thermally connected to the transistors at least in some regions.

By using the temperature sensor matrix, the temperature distribution within the half-bridge module and the respective transistors can be precisely detected. An estimation of the temperature distribution based on a software simulation is therefore no longer necessary. The precise metrological detection of the single-chip temperatures of the transistors enables the design of the power semiconductor, which consists of multiple half-bridge modules, to be significantly optimized.

The measure can either result in a reduction in the number of transistors used and thus a cost reduction or, if the configuration remains the same, a performance increase, since the transistors can be operated closer to their temperature limit.

Furthermore, due to the precise temperature monitoring, controlled operation of the transistors in the range of the maximum permissible junction temperature is possible. This could significantly reduce the size of a cooling system of the vehicle and increase the efficiency or the range.

According to one exemplary embodiment, the temperature sensors of the temperature sensor matrix can be read out individually or sequentially via connection terminals. This measure enables the respective temperature sensors to be read out depending on the required measurement frequency. Simultaneously reading out of the temperature sensors is enabled by an individual connection of the temperature sensors by way of the connection terminals or the connection lines.

If the temperature sensors are read out sequentially, multiple temperature sensors can use one connection terminal jointly, due to which the number of the connection terminals is reduced. For example, two or three temperature sensors can share a common connection terminal with one another to enable the measured values of the respective temperature sensors to be read out sequentially.

According to a further embodiment, a connection terminal is electrically connected to at least one temperature sensor. Two connection terminals are required as electrical connection lines for each temperature sensor. The flexible connection of the temperature sensors enables the joint use of connection terminals, due to which the production expenditure of the temperature sensor matrix is reduced.

According to a further exemplary embodiment, the temperature sensors of the temperature sensor matrix are designed as NTC thermistors, PTC thermistors, or thermocouples. As a result of this measure, temperature sensors of any design can be used for measuring and monitoring the junction temperature of the transistors. A cost-efficient production of the temperature sensor matrix is possible.

According to a further embodiment, the temperature sensors of the temperature sensor matrix are arranged essentially congruently with the transistors and/or connecting lines of the transistors of the half-bridge module. Such an arrangement of the temperature sensors minimizes the transfer paths of the heat transport between the transistors or connecting lines and the temperature sensors. In this way, a particularly fast-reacting temperature measurement of the temperature distribution along the half-bridge module can be implemented with minimal time delays.

According to a further exemplary embodiment, the temperature sensor matrix is designed in the form of a grid of connection terminals and temperature sensors or in the form of a second substrate, wherein the temperature sensor matrix is arranged in parallel to the first substrate. This measure enables the temperature sensor matrix to be produced quickly and compactly. In addition, the temperature sensor matrix can be aligned particularly precisely with respect to the first substrate.

According to a further embodiment, the temperature sensor matrix is potted jointly with the transistors of the half-bridge module in a potting compound, wherein the connection terminals of the temperature sensor matrix are led out of the potting compound. To metrologically detect the individual chip temperatures or junction temperatures of the respective transistors precisely during operation of the vehicle, the transistors and the temperature sensor matrix are jointly potted in a mold. The temperature sensor matrix is positioned directly above the semiconductor chips or transistors before the potting. For this purpose, the respective connection terminals are led to the outside and can be electrically tapped outside the potting compound.

According to a further aspect of the invention, a temperature sensor matrix is provided. The temperature sensor matrix can preferably be used for a half-bridge module according to the invention. The temperature sensor matrix has multiple temperature sensors and multiple connection terminals. The connection terminals are connected to the temperature sensors in an electrically conductive manner, wherein each connection terminal is connected to at least one temperature sensor.

The precise, metrological detection of the single-chip temperatures with the aid of the temperature sensors enables the design of power semiconductors in the automotive sector to be optimized. This prevents costly oversizing of the components and thus results in a cost reduction. If the configuration remains the same, a performance increase is possible, since the transistors, in particular SiC MOSFETs, can be operated closer to their temperature limit.

Furthermore, this measure makes optimal use of the SiC technology to operate the semiconductors of the transistors at their maximum permissible chip temperature of 200° C. As a result, a smaller amount of heat has to be dissipated, due to which the cooling system of the vehicle is reduced in size. As a result, an increase in the efficiency and range of electrically driven vehicles is possible.

BRIEF DESCRIPTION OF THE FIGURES

The invention is schematically illustrated in the drawings with the aid of embodiments and is described further with reference to the drawings. In the figures.

DETAILED DESCRIPTION

Figure 1:
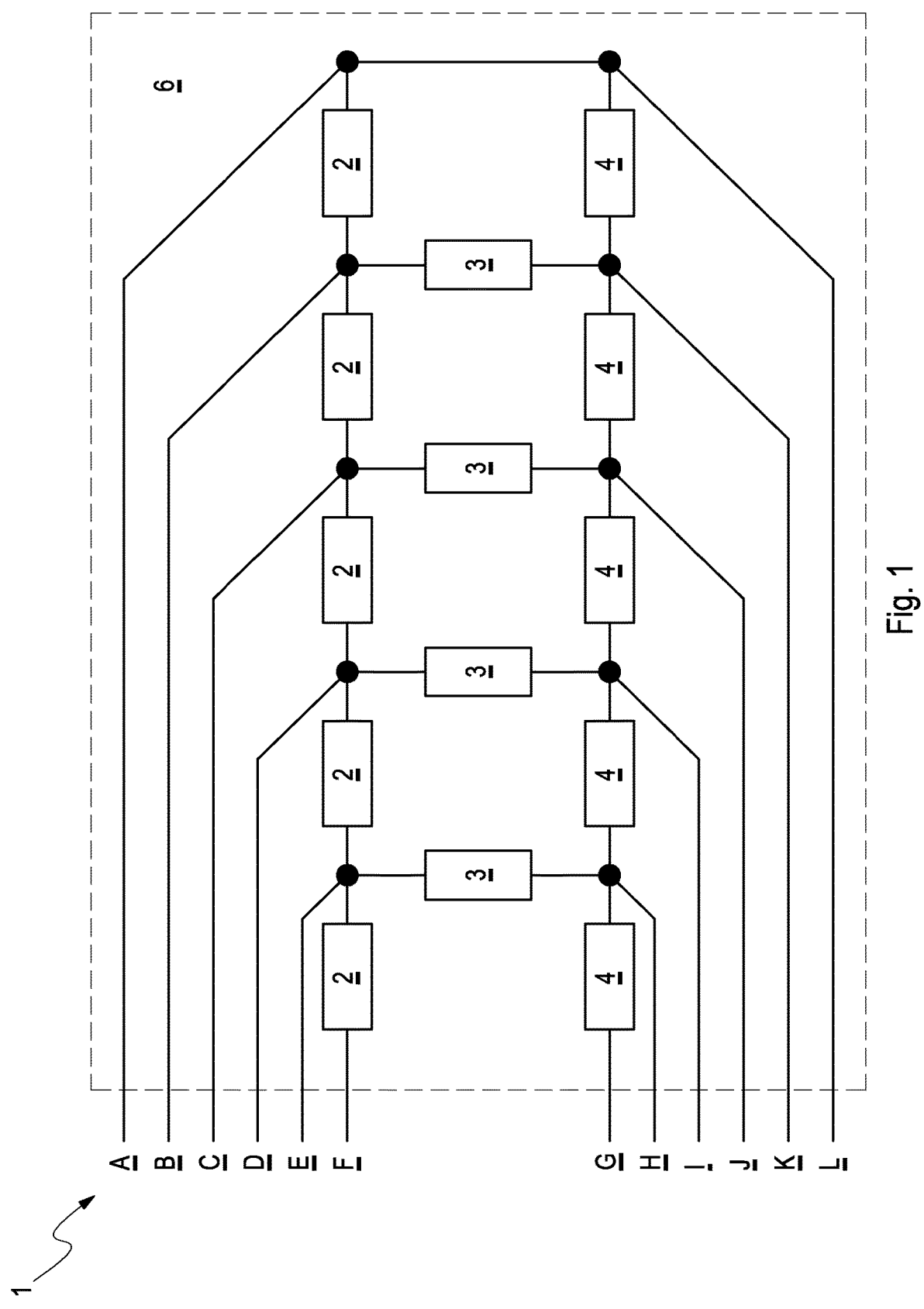
FIG. 1 shows a temperature sensor matrix according to an exemplary embodiment of the invention and FIG. 2 shows a half-bridge module according to the invention having a temperature sensor matrix from FIG. 1.

FIG. 1 shows a temperature sensor matrix 1 according to an exemplary embodiment of the invention. The temperature sensor matrix 1 has multiple temperature sensors 2, 3, 4. In the illustrated exemplary embodiment, fifteen temperature sensors 2, 3, 4 are provided.

The temperature sensors 2, 3, 4 are designed, for example, as PTC thermistors and thus have a positive temperature coefficient. The electrical resistance is directly dependent on the temperature in this case. Alternatively, the use of temperature sensors 2, 3, 4 of the temperature sensor matrix 1 in the form of NTC thermistors, thermocouples, and the like is possible.

The temperature sensors 2, 3, 4 are arranged in three rows and electrically coupled by connection terminals or the connection lines A-L. Two connection terminals A-L are connected to each temperature sensor 2, 3, 4 to measure the electrical resistance of the temperature sensors 2, 3, 4.

To minimize the number of the employed connection lines to the temperature sensors 2, 3, 4, each two or three temperature sensors 2, 3, 4 can share a connection line A-E, H-L with one another. The temperature sensors 2, 3, 4 are connected to one another partly in series and partly in parallel via the connection lines A-E, H-L by such an arrangement.

The temperature sensor matrix 1 can be embodied on a second substrate 6 or as a wire frame made up of the connection terminals A-L. As a result, the temperature sensor matrix 1 can be used to measure a temperature distribution. For example, in order to metrologically detect individual chip temperatures of transistors 16, 17, 18 shown in FIG. 2 precisely during operation of an electric vehicle, the temperature sensor matrix 1 is arranged in parallel to the transistors 16, 17, 18. In the exemplary embodiment described, the temperature sensor matrix 1 is attached directly above the semiconductor chips or the transistors 16, 17, 18 and potted jointly with them. For this purpose, the respective connection terminals A-L are led to the outside and can be tapped outside a potting compound 22.

By way of the taps A-L, it is possible during operation to activate each sensor path or each temperature sensor 2, 3, 4 sequentially and thus to detect the temperature of the respective temperature sensor 2, 3, 4.

Figure 2:
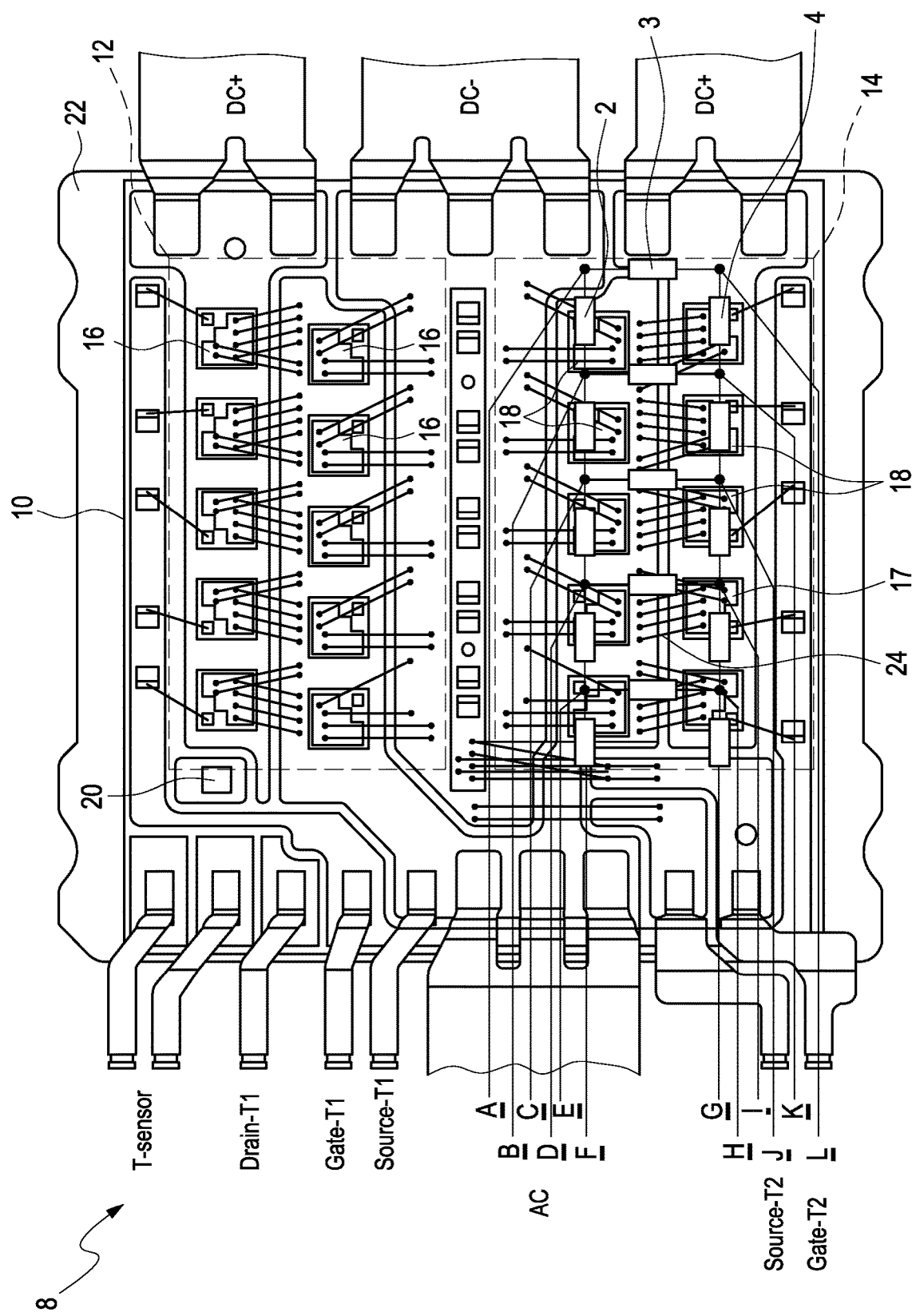

FIG. 2 shows a half-bridge module 8 according to the invention having a temperature sensor matrix 1 from FIG. 1 To illustrate the arrangement, the temperature sensor matrix 1 is placed schematically on a first printed circuit board 10 of the half-bridge module 8 and enables the components of the first printed circuit board 10 to be seen. FIG. 2 also shows an internal chip configuration in a top view including the associated connections.

The half-bridge module 8 has two switching units 12, 14, which each consist of multiple transistors 16, 17, 18 connected in parallel and/or in series. In the exemplary embodiment shown, the transistors 16, 17, 18 are designed as SiC MOSFETs and can be operated at a maximum junction temperature of 200° C.

To illustrate the differences between the half-bridge module 8 according to the invention and a half-bridge module according to the prior art, the temperature sensor matrix 1 according to the invention is only arranged on a second switching unit 14.

The first switching unit 12 corresponds to the prior art and has a single temperature sensor 20, which is arranged on the first printed circuit board 10 next to the transistors 16 of a first switching unit 12. As a result, precise measurement of the temperatures of respective transistors 16 is not possible.

Due to the positioning or placing of the temperature sensor matrix 1 on the transistors 17, 18 of the second switching unit 14, the temperature distribution and the temperatures of the transistors 17, 18 can be measured directly.

The temperature sensors 2, 3, 4 of the temperature sensor matrix 1 are thermally connected to the transistors 17, 18 at least in some regions. For example, the temperature sensors 2, 3, 4 can be thermally coupled to the transistors 17, 18 via a potting compound 22 or by direct physical contact.

The temperature sensors 2, 3, 4 are adapted within the temperature sensor matrix 1 to a position, number, and alignment of the transistors 17, 18. The temperature sensors 2, 3, 4 of the temperature sensor matrix 1 are thus essentially congruent with the transistors 17, 18 and/or connecting lines 24 of the transistors 17, 18 of the half-bridge module 8.

To measure the temperature of a transistor 17, the connection terminals H and I of the temperature sensor matrix 1 can be evaluated. The evaluation of the connection terminals D and I enables the thermal monitoring of the connecting lines 24 of the transistor 17.

The further connections drain, gate, source led out of the potting compound 22 enable the transistors 16, 17, 18 to be activated. The connections DC+, DC− are used for supplying a battery (not shown), which is used as a direct current source. The voltage provided by the battery is converted into an AC voltage, which is output at the connection AC. As a result, an electric motor (not shown) of the vehicle can be operated with the aid of the half-bridge module 8 if, for example, a B6 circuit made up of three half-bridge modules 8 is used.

LIST OF REFERENCE SIGNS 1 temperature sensor matrix
2 temperature sensor of a first row
3 temperature sensor of a second row
4 temperature sensor of a third row
6 second substrate
8 half-bridge module
10 first substrate
12 first switching unit
14 second switching unit
16 transistor of the first switching unit
17 transistor of the second switching unit
18 further transistor of the second switching unit
20 temperature sensor according to the prior art
22 potting compound
24 connecting line of a transistor
A-L connection terminals of the temperature sensor matrix

The invention claimed is:

1. A half-bridge module, comprising:
two switching units, each consisting of multiple transistors connected in parallel and/or in series and arranged on a first substrate, and
a temperature sensor matrix comprising a plurality of temperature sensors which are thermally coupled to the transistors,
wherein the plurality of temperature sensors are configured to be read out individually or sequentially via a plurality of connection terminals extending from the temperature sensor matrix, and
wherein the plurality of temperature sensors, within the temperature sensor matrix, are electrically connected to one another partly in series and partly in parallel via the plurality of connection terminals.

2. The half-bridge module as claimed in claim 1, wherein each of the plurality of connection terminals corresponds to two or more of the plurality of temperature sensors.

3. The half-bridge module as claimed in claim 2, wherein one or more of the plurality of connection terminals corresponds to three of the plurality of temperature sensors.

4. The half-bridge module as claimed in claim 1, wherein the plurality of temperature sensors are provided in greater number than the plurality of connection terminals.

5. The half-bridge module as claimed in claim 4, wherein the plurality of connection terminals are configured such that each of the plurality of temperature sensors are individually addressable by a unique combination of two of the plurality of connection terminals.

6. The half-bridge module as claimed in claim 1, wherein the plurality of temperature sensors comprise at least one of NTC thermistors, PTC thermistors, and thermocouples.

7. The half-bridge module as claimed in claim 1, wherein the temperature sensors of the temperature sensor matrix are congruently arranged with the transistors.

8. The half-bridge module as claimed in claim 1, wherein the temperature sensor matrix is assembled on a second substrate which is arranged parallel to the first substrate.

9. The half-bridge module as claimed in claim 1, wherein the temperature sensor matrix is arranged above the transistors and jointly potted with the transistors in a potting compound such that the plurality of connection terminals are led out of the potting compound.

10. A temperature sensor matrix comprising:
a plurality of temperature sensors which are configured to be thermally coupled to transistors of a half-bridge module,
wherein the plurality of temperature sensors are configured to be read out individually or sequentially via a plurality of connection terminals extending from the temperature sensor matrix, and
wherein the plurality of temperature sensors, within the temperature sensor matrix, are electrically connected to one another partly in series and partly in parallel via the plurality of connection terminals.

* * * * *